United States Patent [19]

Ariizumi et al.

[11] Patent Number: 5,101,262
[45] Date of Patent: Mar. 31, 1992

[54] SEMICONDUCTOR MEMORY DEVICE AND METHOD OF MANUFACTURING IT

[75] Inventors: Shoji Ariizumi, Tokyo; Fujio Masuoka, Yokohama, both of Japan

[73] Assignee: Kabushiki Kaisha Toshiba, Kawasaki, Japan

[21] Appl. No.: 737,603

[22] Filed: Jul. 25, 1991

Related U.S. Application Data

[63] Continuation of Ser. No. 449,150, Dec. 15, 1989, abandoned, which is a continuation of Ser. No. 195,455, May 16, 1988, abandoned, which is a continuation of Ser. No. 893,806, Aug. 6, 1986, abandoned.

[30] Foreign Application Priority Data

Aug. 13, 1985 [JP] Japan .............................. 60-177849
Aug. 13, 1985 [JP] Japan .............................. 60-177850

[51] Int. Cl.⁵ .................... H01L 29/10; H01L 29/04; H01L 23/48
[52] U.S. Cl. ................................. 357/71; 357/23.4; 357/23.9; 357/59; 357/65
[58] Field of Search .................. 357/23.3, 23.6, 23.9, 357/59, 67, 65, 71, 23.1, 23.4, 23.14

[56] References Cited

U.S. PATENT DOCUMENTS

| | | | |
|---|---|---|---|
| 3,740,835 | 6/1973 | Duncan | 357/67 |
| 4,169,270 | 9/1979 | Hayes | 357/59 |
| 4,291,391 | 9/1981 | Chatterjee et al. | 357/23.12 |
| 4,330,931 | 5/1982 | Liu | |
| 4,342,149 | 8/1982 | Jacobs et al. | |
| 4,356,623 | 11/1982 | Hunter | 357/23.9 |
| 4,366,613 | 1/1983 | Ogura et al. | |
| 4,376,947 | 3/1983 | Chiu et al. | |
| 4,382,827 | 5/1983 | Romano-Moran et al. | |
| 4,404,733 | 9/1983 | Sasaki | |
| 4,419,809 | 12/1983 | Riseman et al. | |
| 4,419,810 | 12/1983 | Riseman | |
| 4,513,494 | 4/1985 | Batra | |
| 4,616,399 | 10/1986 | Ooka | |
| 4,616,401 | 10/1986 | Takeuchi | |
| 4,641,420 | 2/1987 | Lee | 357/65 |
| 4,649,412 | 3/1987 | Iwase et al. | 357/23.12 |
| 4,707,457 | 11/1987 | Erb | 357/23.6 |
| 4,725,871 | 2/1988 | Yamazaki | 357/23.12 |
| 4,737,835 | 7/1988 | Ariizumi et al. | 357/59 |

FOREIGN PATENT DOCUMENTS

| | | |
|---|---|---|
| 0124115 | 11/1984 | European Pat. Off. |
| 2509315 | 9/1975 | Fed. Rep. of Germany |
| 55-52262 | 7/1980 | Japan |
| 56-21372 | 2/1981 | Japan |
| 56-26470 | 3/1981 | Japan |
| 56-130970 | 10/1981 | Japan |
| 59-96768 | 12/1984 | Japan ............................. 357/23.3 |

OTHER PUBLICATIONS

Tsand, P. J. et al., "Fabrication of High-Performance LDDFETs Technology", IEEE Journal of Solid State Circuits, vol. SC-17, No. 2, Apr. 1982, pp. 220-226.

IBM Technical Disclosure Bulletin, (vol. 27, No. 23, Aug. 1984), Hsieh, "Deep Double-Implanted LDD for Reducing Substrate Current".

"A Limitation of Channel Length in Dynamic Methorics", Nishizawa et al., IEEE Transactions on Electron Devices, vol. ED-27, No. 8, Aug. 1980.

Primary Examiner—J. Carroll
Attorney, Agent, or Firm—Oblon, Spivak, McClelland, Maier & Neustadt

[57] ABSTRACT

A semiconductor memory device including: a semiconductor substrate of a first conductivity type; triple-layer gate electrode structure formed on the semiconductor substrate and having first insulating film and second insulating film on upper and lower sides of the electrode; a pair of first impurity regions of a second conductivity type in the semiconductor substrate for contacting an opposite side face of the gate electrode structure; an impurity region selectively formed in a channel region corresponding to the data to be fixed in the memory device; an insulating wall on a portion of at least one side face of the gate electrode structure; a pair of second impurity regions of the second conductivity type in the substrate, each of the second regions overlapping with a corresponding one of the first impurity regions for contacting an opposite side face of the insulating wall; a contact pad layer connected to one of the second impurity regions for covering at least a portion of the first insulating film; and a wiring layer connected to the contact pad layer.

3 Claims, 7 Drawing Sheets

SEMICONDUCTOR MEMORY DEVICE AND METHOD OF MANUFACTURING IT

The application is a continuation of application Ser. No. 07/499,150, filed on Dec. 15, 1989, abandoned, which is a continuation of application Ser. No. 07/195,455 filed on May 16, 1988, abandoned, which is a continuation of application Ser. No. 06/893,806 filed on Aug. 6, 1986, abandoned.

BACKGROUND OF THE INVENTION

1. Field of the Invention

The present invention relates to a semiconductor memory device for read-only operations which has data written into it at the time of its manufacture and which subsequent to manufacture serves only for read-out of this data.

2. Description of the Prior Art

A read-only memory (referred to below ans a ROM) that serves only for read-out of data is commonly called a mask-program ROM, since data is written into it during the wafer processing stage. There are three types of process in general use for writing in ROM data, (a) a contact process, (b) the SDG process and (c) a process making use of differences in transistor threshold voltages. With process (a), whether "1" level or "0" level data is written in depends on whether or not a data line and the drain of a memory cell transistor is connected by a contact. With process (b), write-in of "1" or "0" data depends on whether a gate oxide film or a field oxide film is formed in the gate region of a memory cell transistor. With process (c), the data written in depends on whether a memory cell transistor's threshold voltage is made high or is left low.

ROMs for which the contact process (a) is employed have the drawback that they have a larger memory cell area than ROMs for which process (b) or (c) is employed, since each individual memory cell needs an individual contact.

FIG. 1 is a circuit diagram of a conventional ROM in which data write-in is effected by process (b) or (c) and FIG. 2 is a plane view of the pattern of two memory cells of this ROM. In these drawings, lines 41 are memory cell gate lines, lines 42 are ROM data lines, lines 43 are ground connection lines, transistors 44 are MOS transistors which constitute memory cells and whose threshold voltages are selectively made high depending on the data written into them and contacts 45 are connected data lines 42 and the drains of memory cell MOS transistors 44. The portion enclosed by the two-dot chain line of FIG. 2 is one memory cell region. Memory cell gate lines 41 are, for example, constituted by polycrystalline silicon whose resistance has been made low by introduction of an impurity. Data lines 42 are constituted by a metal such as aluminium, etc.

With ROMs in which write-in of data is effected by the SDG process (b) or by process (c) employing differences in transistor threshold voltages, the memory cell size can be made smaller than in a ROM for which the contact process (a) is employed, since there only needs to be one contact for every two memory cells. In ROMs for which thes processes are employed, memory cell size going vertically as seen in the drawing is determined by the size of the contact and the interval, indicated as dimension "1" in FIG. 2, between contact 45 and gate line 41. If one tries reducing the size of contact 45 in order to reduce the area occupied by the cell, the result is that the resistance of the contact portions becomes a resistance of a magnitude that cannot be ignored, which means that there are limits to how small contact 45 can be made, and hence limits to reduction of the memory cell size.

Because of this, there has been furthr development in the past to give a ROM which permits reduction of the area occupied by memory cells and hence an increase in capacity. In this ROM, the drain region of a memory cell transistor formed in a silicon semiconductor substrate is connected to a wire which is constituted by silicon, the same material as the drain region, and which extends to above the gate electrode structure. This allows the contact between this wire and a metal wire constituting a data line to be larger. FIG. 3 shows a plane view of the pattern of two memory cells in a ROM such as this. FIG. 4 shows a section along the line a—a' of FIG. 3. In FIGS. 3 and 4, substrate 51 is a P type silicon semiconductor substrate, region 52 is an N+ drain region, region 53 is an N+ source region, layers 54 are gate electrodes constituted by a first polycrystalline silicon layer whose resistance has been made low by the introduction of an impurity, films 55 are insulating films that covers gate electrodes 54 and substrate 51, layer 56 is a wire constituting by a second polycrystalline silicon layer, hole 57 is a contact hole between drain region 52 and wire 56 and hole 58 is a contact hole between wire 56 and a data line 59 of aluminium. The portion enclosed by the one-dot chain line is one memory cell 60 and 61 is a MOS transistor.

In a ROM with this structure, transistor drain region 52 formed in semiconductor substrate 51 and layer 56 constituted by silicon are connected directly via contact hole 57, in a so-called buried method and since there is contact between silicon and silicon, the contact resistance is small and the area of contact hole 57 can be made small. The area occupied by memory cells in this ROM can be reduced to around 85% of the area of memory cells in an SDG process or ion implantation process memory in which the memory cell drain regions are connected to aluminium data lines. Also, since the area of contact hole 58 between aluminium data line 59 and layer 56 constituted by a second layer of polycrystalline silicon can be made larger, the contact resistance in this portion is smaller and so there is no deterioration of transistor characteristics because of contact resistance.

However, the ROM of FIGS. 3 and 4 still has the problem that if the memory capacity is increased still further, the dimensional allowances to allow for misalignment at sections "d" in FIG. 4 in formation of contact hole 57 comes to represent a large proportion of the memory cell dimension in one direction. There are limits to how far the precision of mask alignment can be improved and one cannot hope for any great increase in density unless this problem is solved.

SUMMARY OF THE INVENTION

It is an object of the present invention to provide a semiconductor memory device in which the area occupied by memory cells can be reduced and a great increase in density is realizable, and a method of manufacturing such a device.

A semiconductor memory device including a semiconductor substrate of a first conductivity type; a triple-layer gate electrode structure formed on the semiconductor substrate and having first insulating film and second inculating film on upper and lower sides of the electrode; a pair of first impurity regions of a second conductivity type in the semiconductor substrate for connecting an opposite side face of the gate electrode structure; an impurity region selectively formed in a channel region corresponding to the data to be fixed in the memory device; an insulating wall on a portion of at least one side face of the gate electrode structure; a pair of second impurity regions of the second conductivity type in the substrate, each of the second regions overlapping with a corresponding one of the first impurity regions for contacting an opposite side face of the insulating wall; a contact pad layer connected to one of the second impurity regions for covering at least a portion of the first insulating film; and a wiring layer connected to the contact pad layer.

DESCRIPTION OF THE PREFERRED EMBODIMENTS

An embodiment of the invention will now be described with reference to the drawings. FIG. 5a through FIG. 5f are cross-sections illustrating successive stages in an embodiment of a method of manufacturing a semiconductor memory device according to the invention. The method in this embodiment is an example of practice of the invention in manufacuture of a ROM with N channel MOS transistors as memory cells.

Figure 5A:
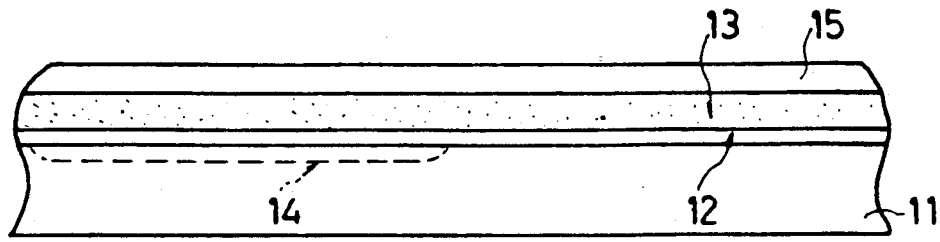
FIGS. 5a–5f shows cross-sections illustrating successive stages in manufacture of a semiconductor memory device according to the invention.

Referring to FIG. 5a, a field insulating film (not shown) is formed by selective oxidation of a P type semiconductor substrate 11. If required, formation of this field insulating film may be preceded by introduction of an inversion prevention impurity in relevant portions of the substrate surface to define a layer for prevention inversion at the time of field insulating film formation. Next, a gate oxide film 12 is formed on the exposed portion of substrate 11 by thermal oxidation and then a first polycrystalline silicon layer 13 having resistance lowered by inclusion of phosphorus (P) is formed to a thickness of 4000–6000 Angstrom units by CVD (chemical vapor deposition) method. Alternatively, one may first form a first polycrystalline silicon layer 13 without an impurity and then after this formation, lower its resistance by doping with phosphorus as an impurity. Next, masking material (not shown) is deposited over the whole surface of the element as it is so far and is patterned by PEP (photoetching process) technique in accordance with write-in data (ROM data). Then, using the patterned mask as an ion implantation mask, an ion implantation region 14 is formed in substrate 11 by selective introduction of boron (B) ions via first polycrystalline silicon layer 13 and gate oxide film 12. Following this, an oxide film 15 about 4000 Angstrom units thick is formed over the whole surface of first polycrystalline silicon layer 13, e.g., by thermal oxidation or CVD method.

Figure 5B:
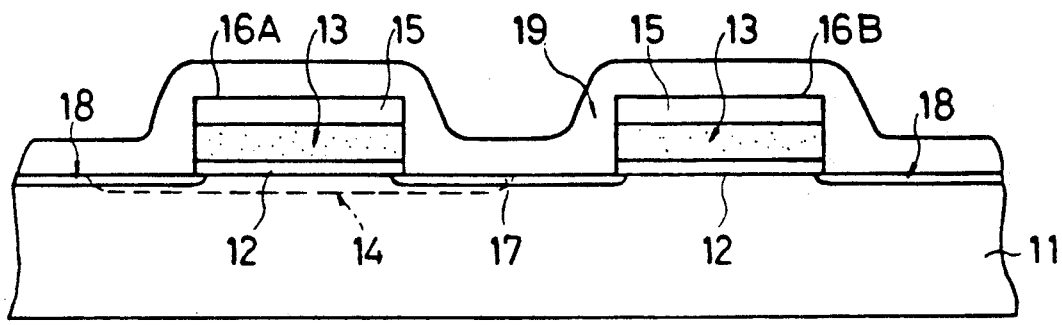

Next, as shown in FIG. 5b, a triple-layer structure consisting of gate oxide film 12, first polycrystalline silicon layer 13 and oxide film 15 is selectively removed by RIE (reactive ion etching) method using a mask in the form of a resist pattern (not shown) formed by PEP technique, so producing triple-layer gate electrode structures 16A and 16B with a triple-layer structure in which first polycrystalline silicon layer 13 is sandwiched between oxide film 15 and gate oxide film 12 above and below it. This is followed by ion implantation of an N type impurity, e.g., phosphorus or arsenic (As), etc., taking gate electrode structures 16A and 16B as a mask, to effect self-aligning formation of N type impurity regions 17 and 18 in substrate 11. Following this, a low temperature oxide film 19 around 5000 Angstrom units thick is formed over the whole surface of the substrate by CVD method.

Figure 5C:
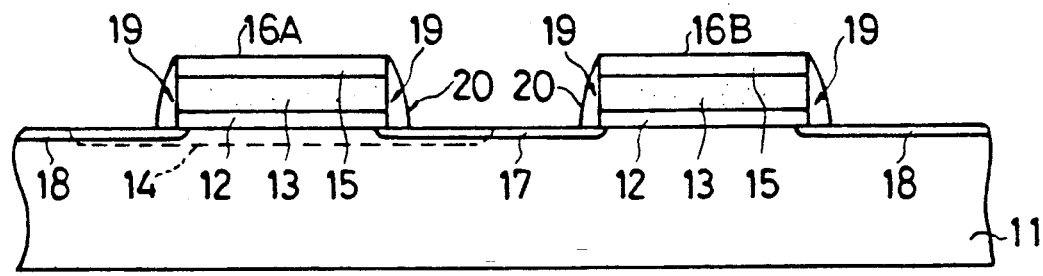

Referring now to FIG. 5c, low temperature oxide film 19 is etched, making use of the anisotropic action obtaining in RIE method, to leave a low temperature oxide film 19 only on the opposite side faces of gate electrode structures 16A and 16B on the sides thereof which contact impurity regions 17 and 18. Simultaneously with this, a buried contact hole 20 is formed above N type impurity region 17.

Figure 5D:
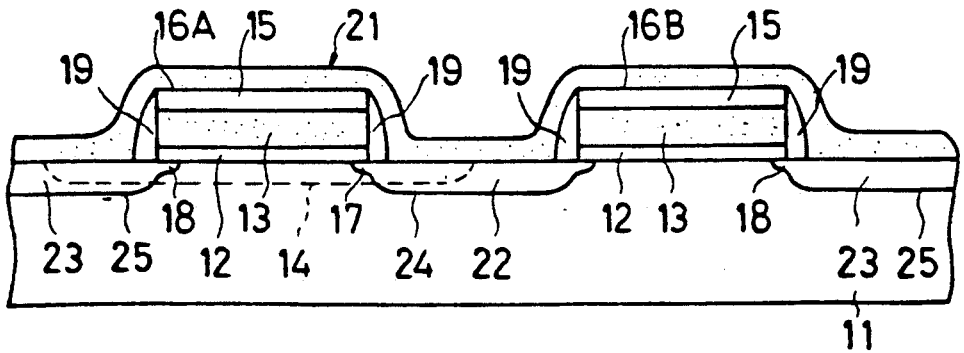

After this, as shown in FIG. 5d, a second polycrystalline silicon layer 21 without an impurity is deposited and formed over the whole surface by CVD method. Next, an impurity is diffused into second polycrystalline silicon layer 21, e.g., by low temperature phosphorus diffusion, whereby the resistance of second polycrystalline silicon layer 21 is lowered and while this happens phosphorus is diffused via the buried contact hole 20 into the contacting impurity region 17 and into impurity regions 18, and high concentration N+ impurity regions 22 and 23, which are deeper than regions 17 and 18, are respectively formed in regions 17 and 18. As a result, there is formed a drain region 24 with a two-stage structure consisting of N type impurity region 17 and N+ impurity region 22 and source regions 25 with a two-stage structure consisting of N type impurity regions 18 and N+ impurity regions 23.

Figure 5E:
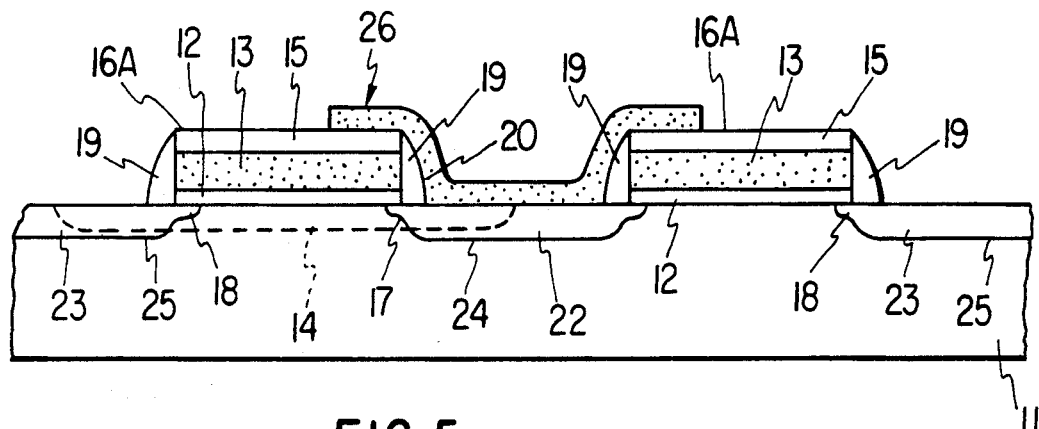

Next, as shown in FIG. 5e, second polycrystalline silicon layer 21 is patterned using a mask in the form of a resist pattern (not shown) that is formed by PEP technique and there is formed a contact pad 26 which contacts the upper surface of drain region 24 of the MOS transistor via buried contact hole 20 and at least a portion of which extends onto the top of gate electrode structures 16A and 16B.

Figure 5F:
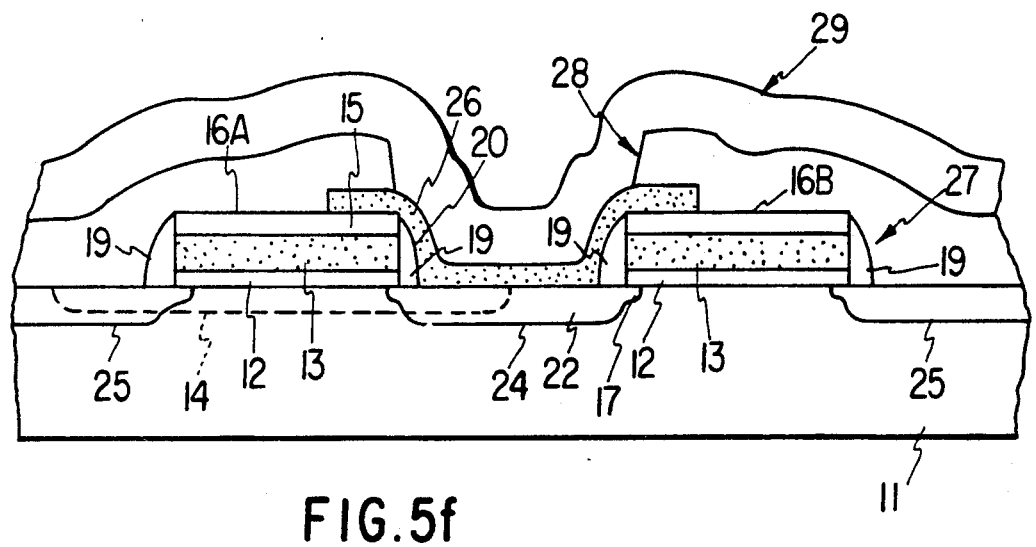

Then, as shown in FIG. 5f, an oxide film 27 about 10,000 Angstrom units thick is deposited over the whole surface by CVD method, a contact hole 28 is opened in oxide film 27 using a mask in the form of a resist pattern (not shown) that is formed by PEP technique and then an aluminium layer 29 is applied by, e.g., vacuum deposition, etc. and patterned to a set shape.

The left-hand MOS transistor in the ROM produced by the above process has a high threshold voltage since ion implantation region 14 is in the channel region between its drain and source regions, whereas the right-hand MOS transistor has no ion implantation region between its drain and source regions and so its threshold voltage remains at its original low level. In this manner, therefore, one has "1" level and "0" level data written in.

Figure 1:
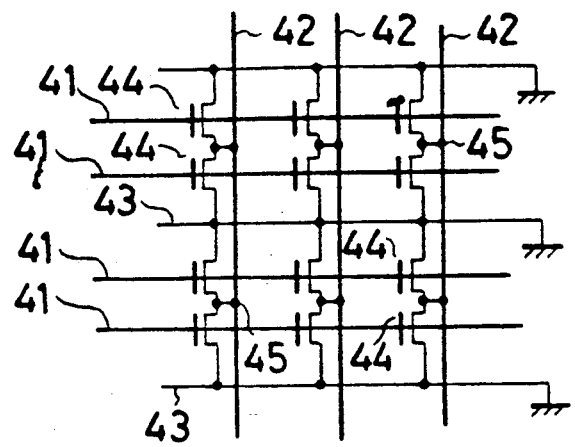
FIG. 1 is a circuit diagram of a conventional ROM.
Figure 2:
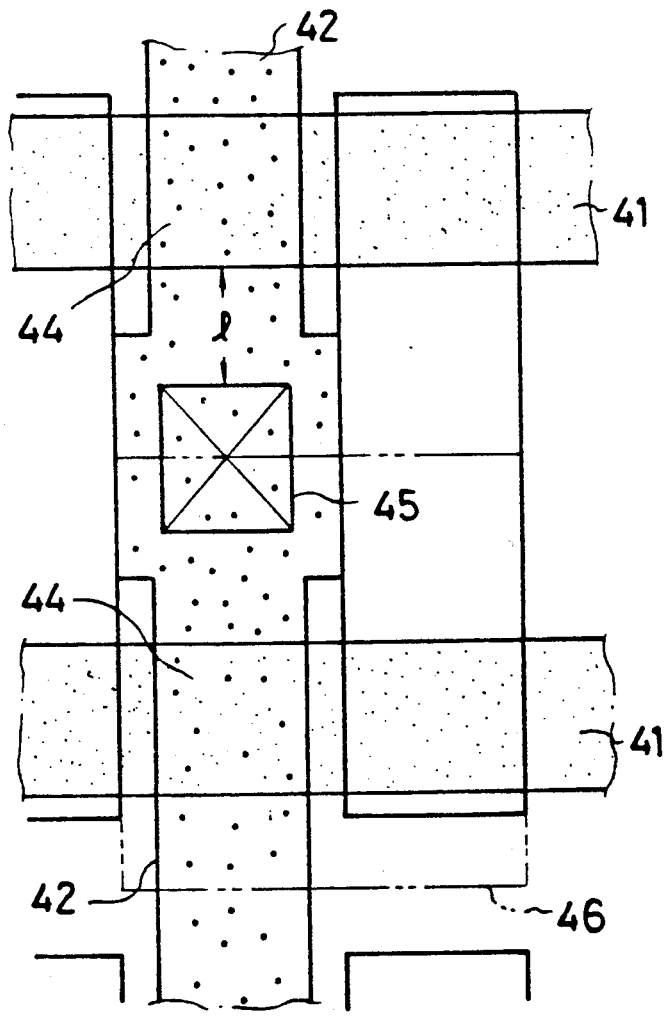
FIG. 2 is a plane view of the memory cell pattern of the ROM of FIG. 1.
Figure 3:
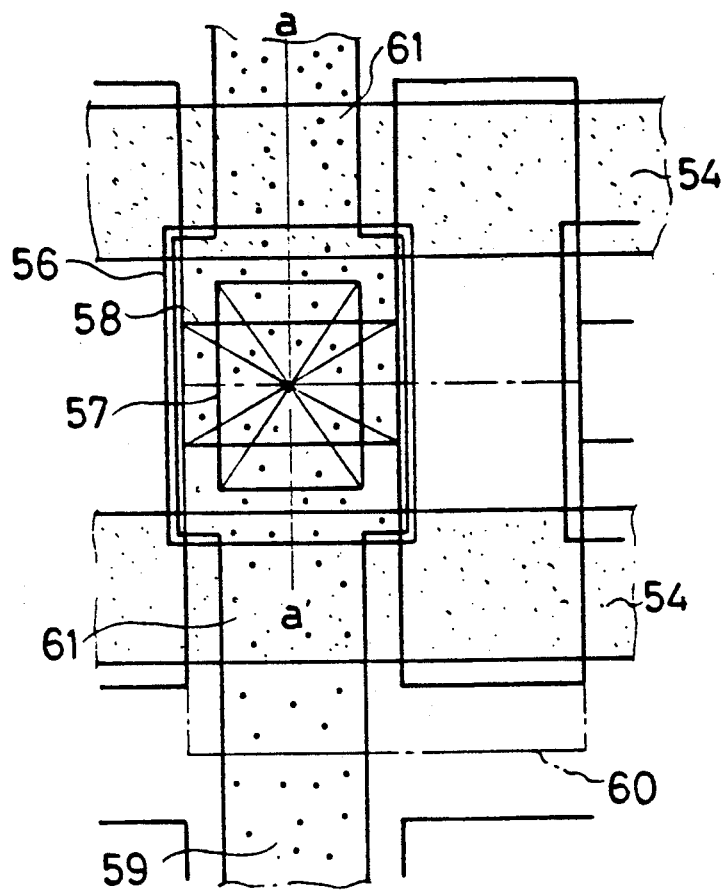
FIG. 3 and FIG. 4 are respectively a plane view and a cross-section of another conventional ROM.
Figure 4:
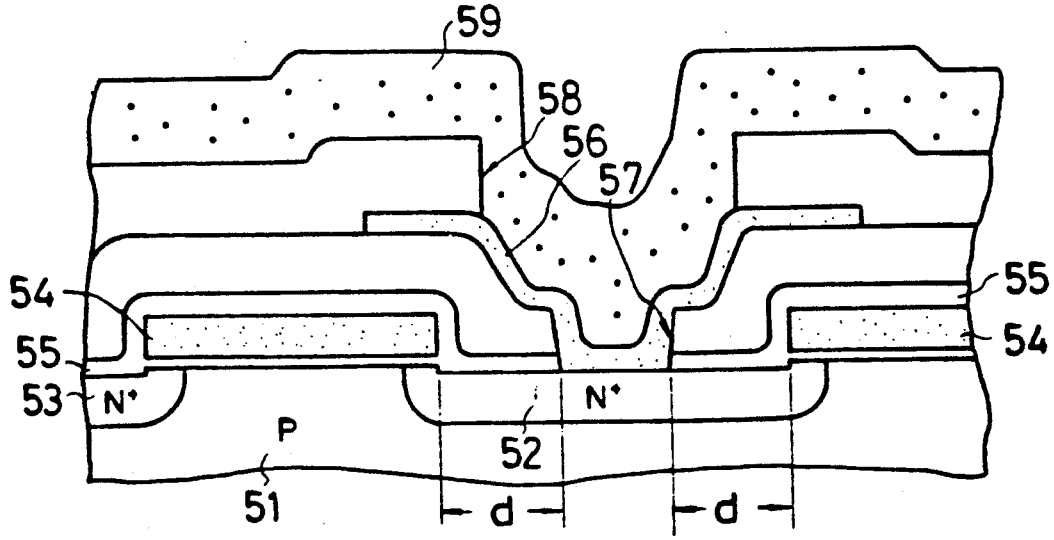
Figure 6:
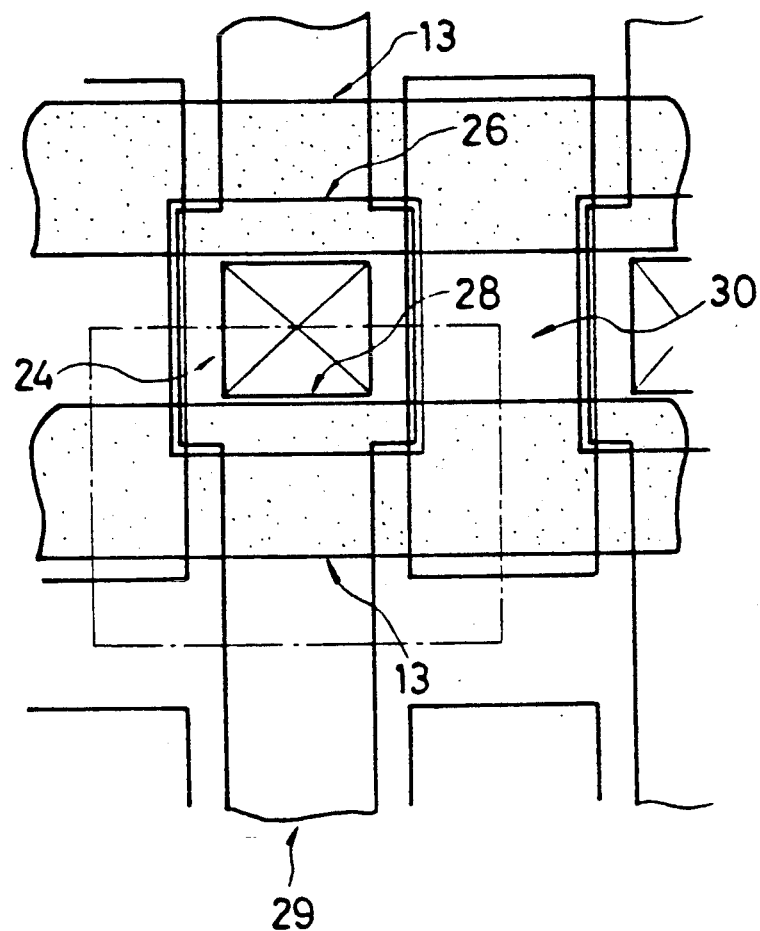
FIG. 6 is a plane view of the ROM memory cell pattern in one embodiment of the invention produced by these steps.

FIG. 6 is a plane view of the pattern of two memory cells of a ROM produced in the manner described above. First polycrystalline silicon layer 13 in FIG. 6 serves as a ROM gate line 41 such as shown in FIG. 1, while patterned aluminium layer 29 serves as a ROM data line 42. The portion enclosed by the one-dot chain line in FIG. 6 constitutes one memory cell region. Aluminium layer 29 constituting a data line 42 is connected via contact hole 28 to contact pad 26 constituted by second polycrystalline silicon layer 21, and contact pad 26 is also connected via contact hole 20 (not shown in FIG. 6) to drain region 24. Since the formation of contact hole 20 is such that it is self-aligned with respect to gate electrode structures 16A and 16B, the dimensional allowance "d", that is needed in the conventional ROM shown in FIG. 4 to allow for mask aligment errors, is practically unnecessary in the device of this embodiment. Further, since contact hole 20 is also formed in self-alignment with respect to the field insulation film 30 shown in FIG. 6 for separating elements, there is no need for a dimensional allowance to allow for alignment errors in this direction either. The area occupied by memory cells in the ROM of this embodiment can be reduced by 30–40% relative to the conventional cells shown in FIG. 2 and by 10–20% relative to the conventional cells shown in FIG. 4. Thus, cell size can be successfully reduced and much greater density is achievable in manufacture to the same design standards as for conventional ROMs. Further, the manufacturing process for realization of the device can be an extension of prior art and the ROM reliability can therefore be made satisfactorily high.

Drain region 24 and source regions 25 in a device manufactured by the method of the above embodiment are each made structures consisting of two mutually self-aligned stages by double diffusion and form regions with a smooth gradient in the direction of depth, thus giving MOS transistors with high voltage resistance and memory cells with low-resistance diffusion layer lines.

FIG. 7a through FIG. 7e are cross-sections illustrating stages in another embodiment of a method for manufacturing a semiconductor memory device according to the invention. This embodiment, also, is an example of manufacture of a ROM using N channel MOS trasistors as memory cells.

Figure 7A:
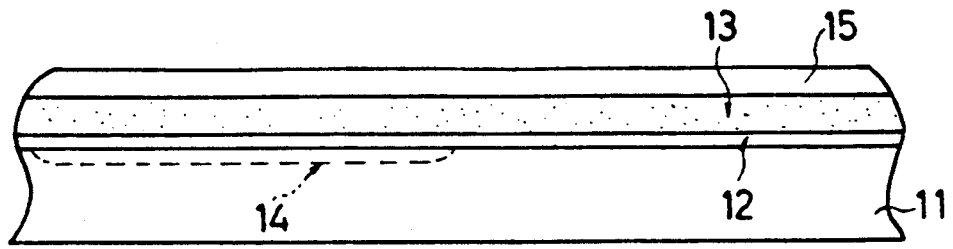
FIGS. 7a–7e shows cross-sections illustrating successive stages in manufacture of a semiconductor memory device by another embodiment according to the invention.
Figure 7B:
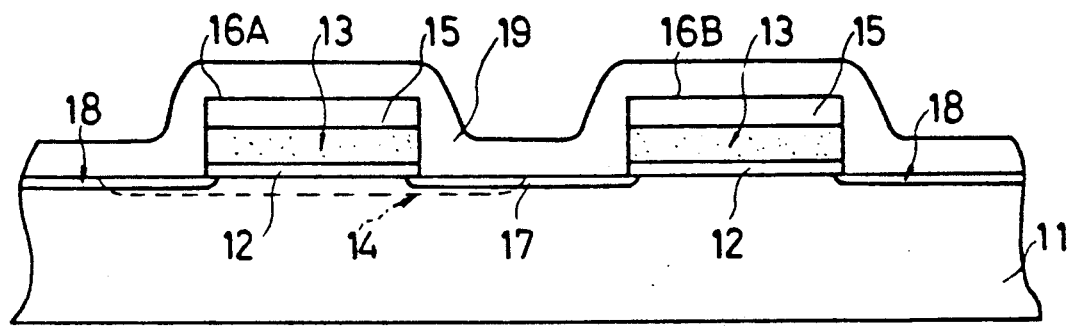

Description of the stage shown in FIG. 7a and FIG. 7b will be omitted since they are the same as in FIG. 5.

Figure 7C:
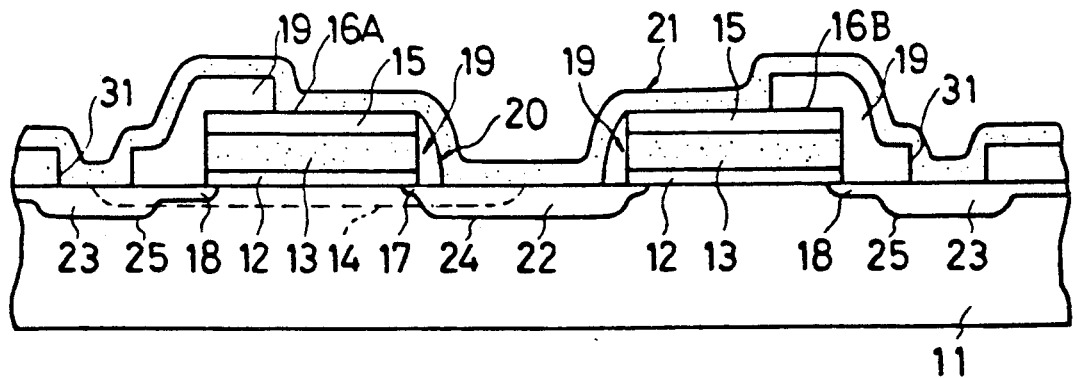

Referring to FIG. 7c, in etching of low temperature oxide film 19 making use of the anisotropic etching effect obtaining in RIE method, the etching is done so that oxide film 19 is left in the form of side walls only on N type impurity region 17 side. In more detail, N type impurity region 18 sides are covered by an etching resistant mask and then RIE is effected. As a result of this process, low temperature oxide film 19 is left in the form of side faces only at the sides of gate electrode structures 16A and 16B that contact impurity region 17, while at the sides that contact impurity region 18, low temperature oxide film 19 is left extending onto the top of gate electrode structures 16A and 16B. Simultaneously with this, a buried contact hole 20 is formed above N type impurity region 17. After this, contact holes 31 going through to the N type impurity regions 18 are formed by PEP technique in the oxide film 19 portions that are left in the preceding stage. Alternatively, contact holes 31 may be formed at the same time as buried contact hole 20. Next a second polycrystalline silicon layer 21 without an impurity is deposited and formed over the whole surface by CVD method and has its resistance made low by diffusion of an impurity into it, e.g., by low temperature phosphorus diffusion, etc., this being accompanied by phosphorus diffusion through buried contact hole 20 into impurity region 17 contacting it and through contact holes 31 into impurity regions 18 contacting them, so resulting in formation in these regions of high concentration N+ impurity regions 22 and 23 which are deeper than their respective regions. As a result, there is formed a impurity region 22 with a two-stage structure consisting of N type impurity region 17 and N+ drain region 24 and source regions 25 with a two-stage structure consisting of N type impurity region 18 and N+ impurity region 23.

Figure 7D:
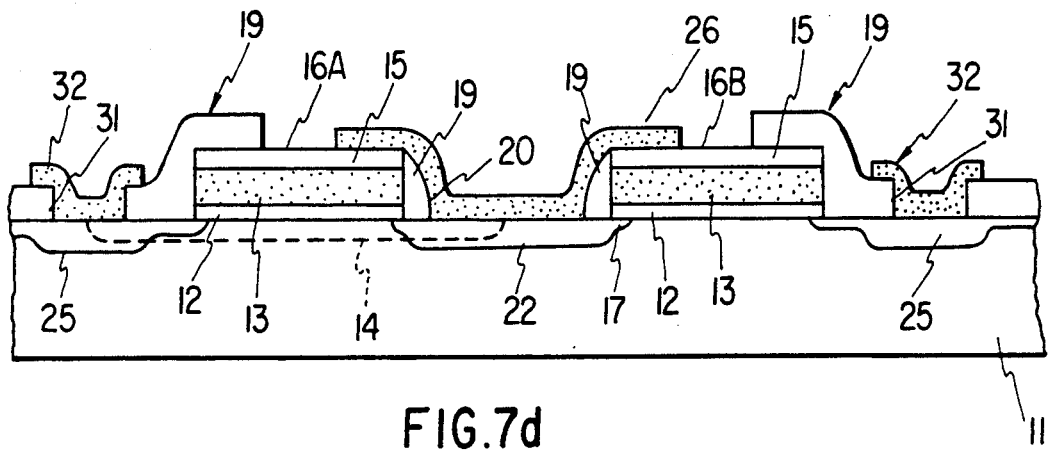

Next, as shown in FIG. 7d, second polycrystalline silicon layer 21 is patterned using a mask in the form of a resist pattern (not shown) that is formed by PEP technique, so resulting in formation of a contact pad 26 which contacts the upper surface of drain region 24 of the MOS transistor via buried contact hole 20 and at least a portion of which extends onto the top of gate electrode structures 16A and 16B and formation of contact pads 32 which contact the surfaces of source regions 25 via contact holes 31.

Figure 7E:
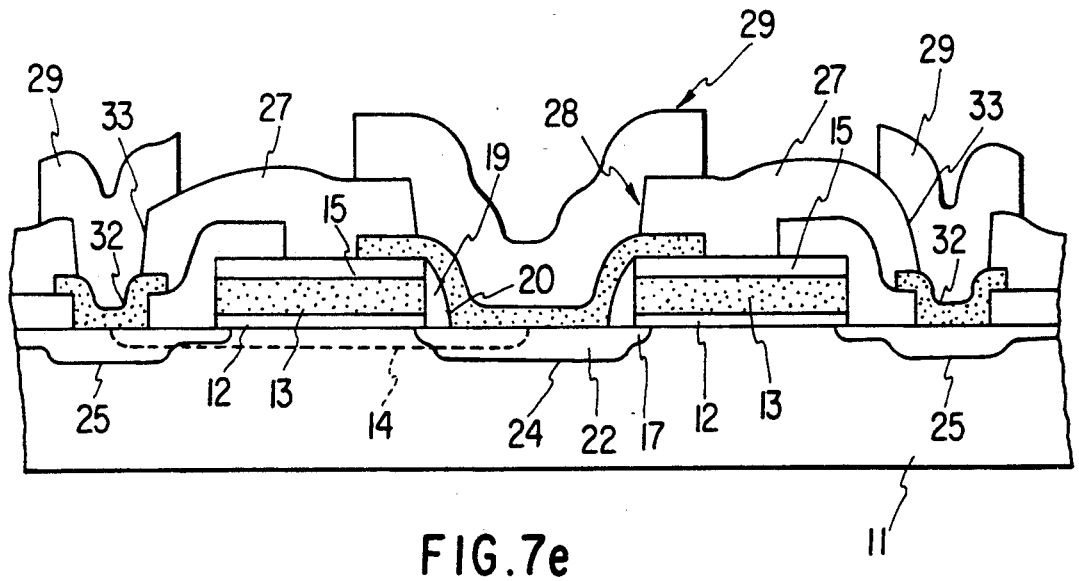

Then, as shown in FIG. 7e, an oxide film 27 about 10,000 Angstrom units thick is deposited over the whole surface by CVD method, contact holes 28 and 33 are opened in oxide film 27 using a mask in the form of a resist pattern (not shown) that is formed by PEP technique and then an aluminium layer 29 is applied by vaccum deposition, etc. and patterned to a set shape.

The ROM manufactured by this process is not a device in which the source regions 25 of the various memory cells connected to ground lines 43 (FIG. 1) are themselves used as lines but is one in which the sources are grounded by wires (ground line) defined by aluminium layer 29.

Needless to say, the invention is not limited to the embodiments described above but it is possible to have a variety of modification. For example, although the MOS transistor gate electrodes and contact pads are described as being polycrystalline silicon in the embodiments above, they may also be a mixture of a high melting point metal and silicon, e.g., molybdenum silicide or tungsten silicide, etc., or be constituted as a two-layer film using a high melting point metal and silicon. Reasons why such layers can be used are that they can contain an impurity for diffusion, that they can be used as lines with comparatively high conductivity and that there is no risk of the thermal history in the various processing stages leading to melting.

Further, although in the above embodiments description is given with reference to practice of the invention in a ROM which has a P type semiconductor substrate and has memory cells constituted by N channel MOS transistors, the invention may, of course, also be practised in ROMs such as ROMs with N well CMOS (complementary MOS) structures using P type semiconductor substrates or a ROMs with P well CMOS structures using N type semiconductor substrates, etc.

As described above, according to the invention extra dimensional tolerances are unnecessary and which therefore makes it possible to reduce the area occupied by memory cells and hence to achieve a much higher density.

Various modifications and variations could be made to the invention without departing from the scope or spirit of the invention.

What is claimed is:

1. A semiconductor memory device comprising:

a semiconductor substrate of a first conductivity type;

first and second gate electrode structures formed on said semiconductor substrate, each including an electrode and a first insulating film and a second insulating film on upper and lower sides of said electrode, respectively, and each having first and second side faces on opposed coplanar sides thereof;

a common impurity region of a second conductivity type formed in said substrate between said first and second gate electrode structures and adjacent to said first side faces thereof;

a pair of first impurity regions of a second conductivity type formed in said semiconductor substrate at adjacent to respective second side faces of said first and second gate electrode structures for defining respective channel regions, said respective channel regions being beneath said first and second gate electrode structures and between said common impurity region and respective of said pair of first impurity regions;

an impurity region formed in the channel region underlying said first gate electrode structure corresponding to data to be fixed in said memory device;

a first insulating wall formed on the first side face of said first gate electrode structure, and a second insulating wall formed on the first side face of said second gate electrode structure, said first and second insulating walls being produced on the opposed coplanar sides of said first and second gate electrode structures by anisotropic etching and defining a self-aligned buried contact hole between said first and second insulating walls;

a second impurity region of the second conductivity type in said substrate overlapping with said common impurity region being formed through said self-aligned buried contact hole;

a contact pad layer connected to said second impurity region through said self-aligned buried contact hole, said contact pad layer being in contact with and covering said first and second insulating walls and at least a portion of said first insulating film; and a wiring layer connected to said contact pad layer.

2. A semiconductor memory devive as claimed in claim 1, wherein said contact pad layer is material selected from the group consisting of polycrystalline silicon and a mixture of a high melting point metal and silicon.

3. A semiconductor memory device as claimed in claim 1, wherein each said second impurity region has a greater depth and a higher impurity concentration in said substrate than said first impurity region.

* * * * *